US006345177B1

United States Patent
Renard et al.

(10) Patent No.: US 6,345,177 B1
(45) Date of Patent: Feb. 5, 2002

(54) SIGNAL ANALOG PROCESSING CIRCUIT FOR SATELLITE POSITIONING RECEIVER

(75) Inventors: Alain Renard, Chabeuil; Nelly Suaud, St Vincent de la Commanderie, both of (FR)

(73) Assignee: Sextant Avionique, Velizy Villacoublay (FR)

(*) Notice: Subject to any disclaimer, the term of this patent is extended or adjusted under 35 U.S.C. 154(b) by 0 days.

(21) Appl. No.: 09/355,327
(22) PCT Filed: Jan. 30, 1998
(86) PCT No.: PCT/FR98/00175
  § 371 Date: Aug. 2, 1999
  § 102(e) Date: Aug. 2, 1999
(87) PCT Pub. No.: WO98/34340
  PCT Pub. Date: Aug. 6, 1998

(30) Foreign Application Priority Data

Jan. 31, 1997 (FR) ............................................. 97 01075

(51) Int. Cl.[7] .......................... H04B 1/16; H04B 1/04; H04B 1/26; H04B 1/06; H04B 1/10
(52) U.S. Cl. ...................... 455/313; 455/208; 455/230; 455/260; 455/131; 455/311; 455/316
(58) Field of Search ............................... 455/260, 313, 455/314, 315, 316, 209, 207, 208, 131, 141, 217

(56) References Cited

U.S. PATENT DOCUMENTS 5,781,152 A * 7/1998 Renard et al.
5,822,376 A * 10/1998 Renard
5,850,420 A * 12/1998 Guillard et al.

* cited by examiner

Primary Examiner—Daniel Hunter
Assistant Examiner—Meless Zewdu
(74) Attorney, Agent, or Firm—Oblon, Spivak, McClelland, Maier & Neustadt, P.C.

(57) ABSTRACT

An analog circuit for receiving satellite signals through an antenna. The circuit includes frequency transposition circuits and an analog/digital converter. Each frequency transposition circuit includes at least two frequency dividers of which due first is programmable so as to provide division ratios 140 and 143. The other divider provides one of the division ratios of 10 or 11. A third divider provides ratios of 3, 5, 7 or 8. These division ratios enable a single analog integrated circuit topography to allow a large number of possible applications including civil or military receivers operating on the GPS constellation or on the GLONASS constellation.

11 Claims, 2 Drawing Sheets

SIGNAL ANALOG PROCESSING CIRCUIT FOR SATELLITE POSITIONING RECEIVER

BACKGROUND OF THE INVENTION

1. Field of the Invention

The invention relates to satellite-based position receivers such as GPS (Global Positioning System) or GLONASS (Global Navigation Satellite System) receivers.

2. Discussion of the Background

These systems use a constellation of satellites which rotate around the earth in very precisely determined orbits, that is to say the position of any satellite may be ascertained at any instant. The satellites transmit radio frequency signals containing navigation data and codes which enable each satellite to be identified. These codes phase-modulate (BPSK modulation) a carrier frequency. A receiver, on the ground or on a land, air or sea vehicle, can receive the signals from several satellites simultaneously, accurately calculate its distance from each of the satellites, and thereby deduce its precise position in terms of latitude, longitude and altitude, in a terrestrial reference frame. It may also thereby deduce the date and precise time of reception in the temporal reference frame of the system. Lastly, it may thereby deduce, through Doppler measurements, its own velocity vector in the terrestrial reference frame (the case of a receiver mounted on a mobile vehicle).

The GPS system, like the GLONASS system, uses two distinct radio frequency bands corresponding to a civil application (frequencies L1) and a military application (frequencies L2) respectively. For the GPS system, there is just one frequency L1, equal to 1575.42 MHz and one frequency L2, equal to 1227.60 MHz. For the GLONASS system, there is a different frequency L1 for each satellite of the constellation and, likewise, a different frequency L2 for each satellite; the Glonass band L1 may be regarded, given its current state and future alterations, as extending from 1590 MHz to 1620 MHz. The band L2 extends between 1238 and 1265 MHz.

The detection of the signals from a satellite is carried out by searching for a phase modulation code present in the radio signal. The signals from the satellite are received by an antenna and sent to an analogue circuit which transposes the modulated radio frequency into a lower frequency modulated in the same way, and which converts the transposed signal into digital before sending it to a digital signal processing circuit. It is the digital processing circuit which detects the presence of the code, by correlating it with an identical code generated locally, and which deduces, from the temporal position of the local code, information on pseudo-distances subsequently making it possible to determine the position of the receiver.

It will be understood that the analogue circuit must make it possible to transpose the frequency of the radio signal, without losing the modulation thereof, to a frequency low enough for the transposed signal to be able to be processed in the digital signal processing circuit. The latter is a silicon-based integrated circuit whose working frequency is limited to a few tens of megahertz.

SUMMARY OF THE INVENTION

One of the purposes of the invention is to design the internal circuits of the receiver in such a way that it is easy to adapt one and the same circuit to the construction of receivers of different types and different applications.

The expression "type of receiver" is understood to mean that the receiver is customized for the GPS system or customized for the GLONASS system, or else dual-purpose, that is to say capable of receiving the signals from either of the two systems by choice.

The expression "application" is understood to mean chiefly that the receiver can receive only the signals of the civil frequency band L1 or on the contrary can also receive the signals of the band L2.

It would be desirable, in order to reduce the costs of development of the receivers, for the internal circuits of these receivers to be capable, in the simplest case, of operating solely under the GPS system on the civil frequency L1, or, in the most complicated case, of operating with the bands L1 and L2 of the GPS system and of the GLONASS system. And of course, these circuits ought also to be able to serve for all intermediate applications, for example a purely civil receiver (frequencies L1) which can receive GPS signals and also GLONASS signals.

Digital signal processing circuits can be designed to operate with GLONASS satellites and also with GPS satellites, although the solutions for achieving this are not simple.

The invention relates to the analogue circuit for frequency transposition and for analogue/digital conversion which precedes the digital signal processing circuits. A purpose of the invention is to ease the implementation of the frequency transposition by rendering this implementation as independent as possible of the type of receiver and of the application envisaged.

For reasons to do with protection against the disturbances created by radio signals of any kind which travel through the atmosphere, it is necessary to perform very selective filterings of the signals received, and this then makes it necessary to perform several frequency transpositions. These successive transpositions make it possible to move progressively from the radio frequency to a frequency acceptable in the digital processing circuit.

By way of example, two successive changes of frequency can be used to go from the frequency L1 for GPS (1575.42 MHz) to an intermediate frequency of the order of a few, hundred MHz, and then to a frequency of the order of 20 MHz.

It has already been proposed, in order to reduce the number of local oscillators required to carry out the frequency transposition, in the case of a GPS operating both on the frequency L1 and on the frequency L2, to choose a frequency of around 175 MHz as intermediate frequency, since then the same local oscillator, at a middle frequency between L1 and L2 (around 1400 MHz) can serve to frequency-transpose the signals at frequency L1 and also the signals at frequency L2; the transposed signals can then go through the same circuits (especially the filters) since they are in the same narrow band of frequencies around 175 MHz.

Moreover, as is well known, frequency transposition is carried out in principle by a mixer which receives on the one hand a signal to be transposed and on the other hand the signal from a local oscillator; the local oscillator is based on a pilot oscillator, a frequency divider and a phase-locked loop; one and the same pilot oscillator can then serve to form several local oscillators if several frequency dividers are used.

Lastly, as far as the invention is concerned, t-he final frequency transposition step will be regarded as being performable either in a mixer (as explained above), or in the analogue/digital converter which ultimately prepares the signal destined for the digital signal processing circuit. This is because, when the sampling frequency $F_e$ of a converter is less than twice the central frequency $F_c$ of the spectrum of the signal received by the converter, the phenomenon of spectral aliasing, well known in sampled systems, means that the frequency of the output signal from the converter has a spectrum centered around the difference frequency $F_e-F_c$, this being the equivalent of a frequency transposition from $F_c$ to $F_e-F_c$.

According to the invention there is proposed an analogue circuit for receiving satellite signals, comprising frequency transposition circuits and an analogue/digital converter, characterized in that the analogue circuit comprises, in order to carry out the frequency transposition, at least two frequency dividers, of which the first is programmable so as to provide at least the following division ratios: 140 and 143.

It has been found that these ratios offer noteworthy possibilities of being able to freely choose, without changing circuit and with simple programming, the type of receiver and the desired application thereof from among several different types and applications.

The programming is particularly easy if the divider possesses an electrical control input for the division ratio so as to provide the chosen ratio as a function of the signal set up on this input. A simple control bit makes it possible to choose the value 140 or 143.

Preferably, the second divider then has a division ratio equal to 10 and there is a third divider with ratio 3. However, the third divider is preferably also programmable so as to make it possible to choose, preferably via electrical control, at least one of the following three ratios: 3, 5, or 7.

To broaden the range of possible applications without changing the structure of the analogue circuit, arrangements are preferably made for the first divider to be programmable so as to have the values 140, 143 and 137. For further broadening, it may be programmable so as to provide a fourth value 142. However, the first divider may also be programmable so as to provide all the integer values between 137 and 143, or even between 136 and 143.

The third divider may be programmable so as also to provide a division ratio of 8.

Lastly, the second divider may be programmed so as to provide the value 10 or the value 11, but it is not necessary to make provision for a separate control in respect of this divider, the control of the third divider being sufficient, associated with a very simple decoder, to determine the ratio of the second divider as a function of the ratio imposed on the third divider: as will be seen, the value 11 for the second divider will in principle be systematically associated with the value 8 for the third.

In practice, provision will preferably be made for the circuit to comprise three dividers, and means for making it possible to obtain at least one of the following combinations of division ratios, where N1, N2 and N3 denote the division ratios of the first, second, and third divider respectively:

| N1 = 137 | N2 = 10 | N3 = 3 |
| N1 = 140 | N2 = 10 | N3 = 3 |
| N1 = 140 | N2 = 10 | N3 = 7 |
| N1 = 143 | N2 = 10 | N3 = 5 |
| N1 = 140 | N2 = 10 | N3 = 5 |
| N1 = 143 | N2 = 10 | N3 = 3 |
| N1 = 140 | N2 = 11 | N3 = 8 |
| N1 = 142 | N2 = 10 | N3 = 5 |

These combinations are in fact those which offer, the best practical possibilities of use of the analogue circuit.

Frequency dividers which are programmable may be controlled independently of one another, but it is also possible to make provision, inside the analogue circuit, for a simple decoder, with three input controls, so as to select a combination of three division ratios out of eight possible combinations corresponding to particular predetermined uses of the receiver. The decoder then has outputs for separately controlling the various dividers.

BRIEF DESCRIPTION OF THE DRAWINGS

Other characteristics and advantages of the invention will become apparent on reading the detailed description which follows and which is given with a reference to the appended drawings in which.

DETAILED DESCRIPTION OF THE PREFERRED EMBODIMENTS

Figure 1:
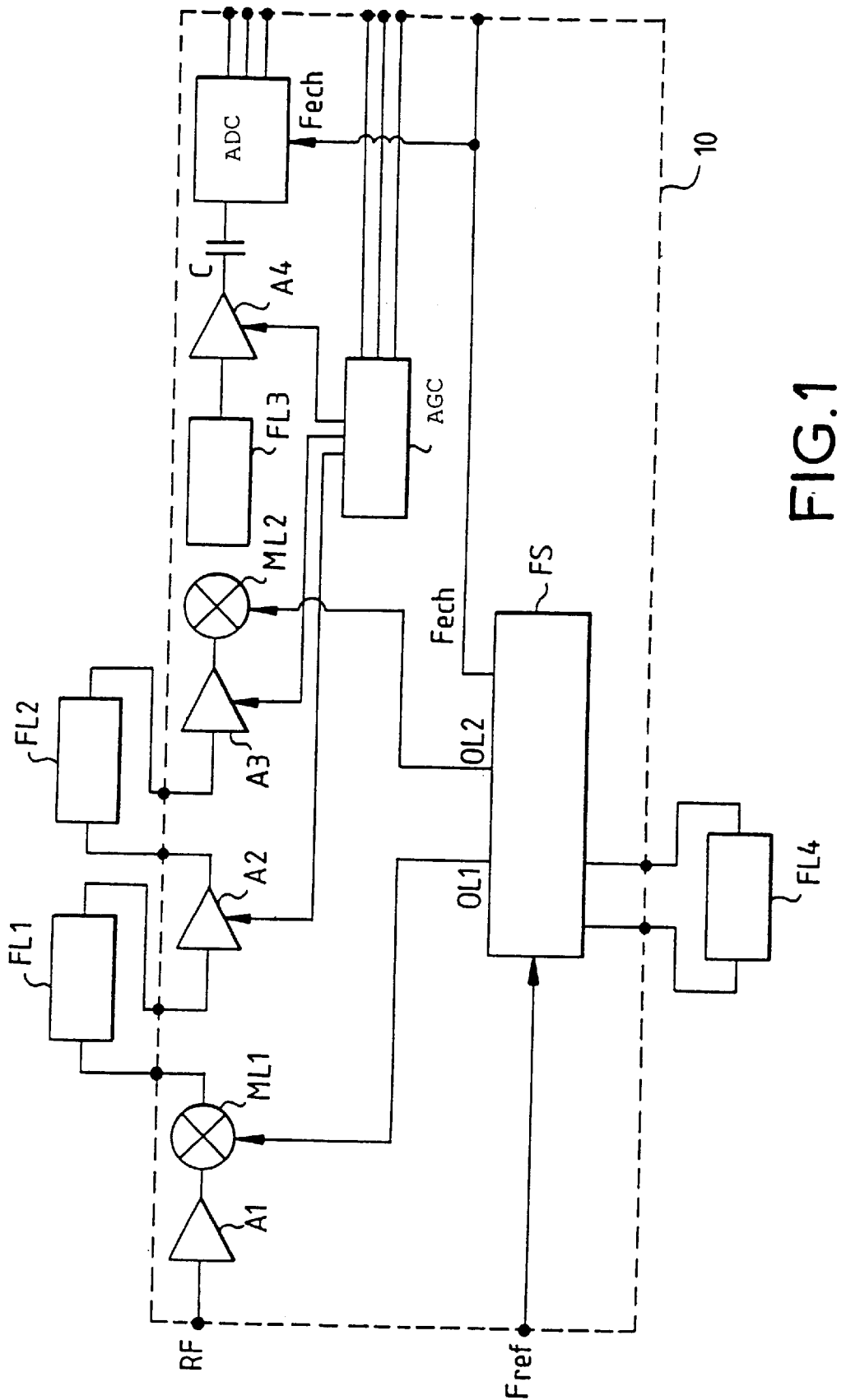
FIG. 1 represents the general makeup of an analogue circuit for receiving satellite signals, with a frequency synthesizer providing three frequencies intended to carry out frequency transpositions.

Represented within a dashed box 10 in FIG. 1 are the circuit elements which form part of an analogue integrated circuit designed to perform the reception of the satellite signals and to provide another integrated circuit (not represented), referred to as the digital signal processing circuit, with the digital signals at a frequency which is acceptable to this latter circuit. The digital signals provided retain the pseudo-random phase modulation of the signals received from the satellites.

The radio frequency signals from the satellites, received through a reception antenna and possibly amplified by a preamplifier (not represented), outside the integrated circuit 10, are applied to an RF input of the integrated circuit.

In the integrated circuit, the radio frequency signals pass through an amplifier Al and then through a first mixer ML1 performing a first frequency transposition. The mixer ML1 receives a local frequency OL1 from a frequency synthesizer FS which provides the various local frequencies required for the frequency transpositions performed in the integrated circuit. The mixer produces signals whose frequency is the difference between the frequencies present on its inputs.

At the output of the mixer ML1, the signals are filtered by a filter ML1 so as to retain only the frequencies centered about the difference between the radio frequency received (1200 MHz to 1600 MHz approximately) and the local frequency OL1 (1350 to 1450 MHz approximately). This difference is 150 to 200 MHz approximately and the filter FL1 is a bandpass filter which allows through only the signals in this latter band. The filter FL1 is preferably outside the integrated circuit, as represented, this being for feasibility reasons.

The signals thus filtered are signals transposed about a first intermediate frequency which is the difference between the nominal frequency received from the satellite and the local frequency OL1. They retain the phase modulation of the satellite signal. These signals return to the integrated circuit and are again amplified in an amplifier A2, then they pass through a second filter FL2, outside the integrated circuit, and then return to an amplifier A3 in the integrated circuit. The amplifiers A2 and A3, as well as an amplifier A4 mentioned later, are preferably controlled-gain amplifiers, and an automatic gain control circuit AGC is provided for this purpose. This circuit is controlled by the digital signal processing circuit and it will not be detailed further since it does not form the subject of the present invention.

The transposed signals at the first intermediate frequency are forwarded from the amplifier A3 to a second mixer ML2 which again transposes them about a second intermediate frequency. The second intermediate frequency is the difference between the first intermediate frequency and a second local frequency OL2 produced by the frequency synthesizer FS.

The second local frequency OL2 is a frequency of the order of 120 to 150 MHz and the second intermediate frequency may be from 1 to 50 MHz.

A filter FL3, which may be internal to the integrated circuit, allows through the signals centered about the second intermediate frequency, with a sufficient bandpass to take into account the satellite signal frequency variations due to the Doppler effect, and sufficient to be able to allow through signals centered about an intermediate frequency of 1 MHZ and also signals centered about a frequency of 50 MHZ. The filter FL3 can be a low-pass filter.

The output signals from the filter FL3 are applied to the fourth amplifier A4, then, through a decoupling capacitor C, to an analogue/digital converter ADC. On outputs S1, S2, S3, the converter provides digital signals (in this example the signals are coded on three bits) representing the amplitude of samples of analogue signals received from the satellite and transposed about the second intermediate frequency. The sampling is carried out at a frequency Fech which originates from the frequency synthesizer FS, but which in some cases could originate from outside the integrated circuit.

In the general case, the converter must have a sampling frequency of greater than twice the maximum frequency of the signals to be converted. However, it is difficult for the converter to have a sampling frequency of greater than 50 MHz. Accordingly, when the second intermediate frequency is relatively high (for example above 25 MHz), a third frequency transposition must be carried out.

This third frequency transposition may be carried out with a third mixer and a third local frequency OL3. However, the sampling frequency Fech of the converter ADC may also be regarded as constituting this third local frequency so that the converter itself performs this third frequency transposition. This results from the known phenomenon of spectral aliasing of the sampled signals when the sampling frequency is less tan twice the frequency of the signals to be sampled: when the frequency spectrum of the signal to be sampled is centered about a frequency $F_c$ (in this instance the second intermediate frequency), the output signal after sampling at the frequency Fech is the same as if a frequency transposition from $F_c$ to $F_{ech} - F_c$ had been performed previously.

Accordingly, for this invention, the analogue/digital converter will be regarded as playing, when necessary, in addition to its conversion role proper, a role of final frequency transposition within the circuitry for processing the analogue signal. And this final frequency transposition uses the sampling frequency $F_{ech}$ as local frequency OL3.

The three local frequencies are produced by a frequency synthesizer FS whose operation is synchronized by a stable reference frequency $F_{ref}$ provided by a pilot oscillator (not represented), outside the integrated circuit (in principle a quartz oscillator). The operation of the synthesizer may moreover make use of a filter FL4 outside the integrated circuit.

Figure 2:
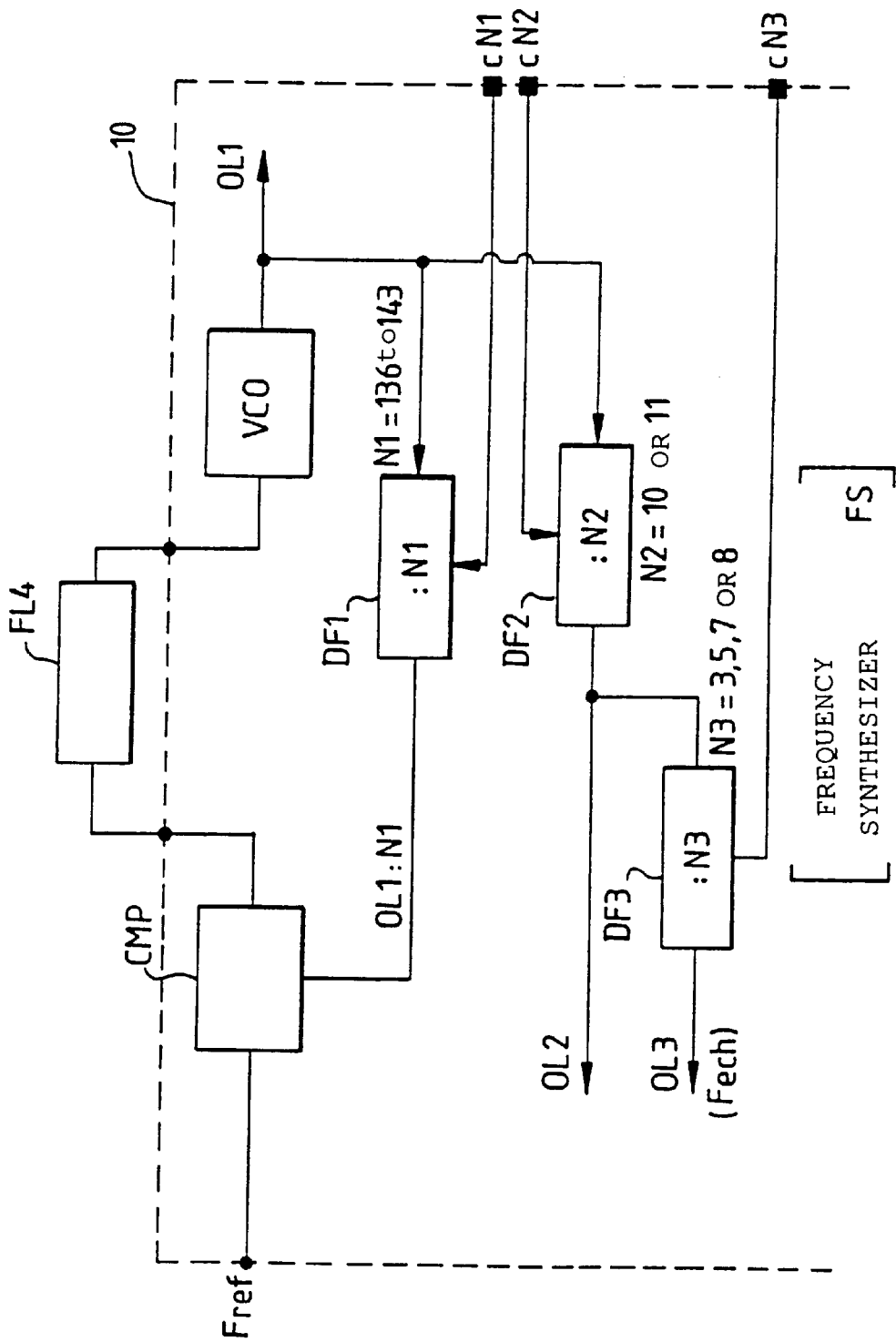
FIG. 2 represents the makeup of the frequency synthesizer according to the invention.

FIG. 2 diagrammatically summarizes OR shows the operation of a frequency synthesizer operating with a phase-lock loop and frequency dividers. The reference frequency $F_{ref}$ of the pilot oscillator is applied to an input of a phase comparator-CMP, another input of which receives a frequency which is a sub-multiple of the first local frequency OL1. The phase comparator produces gating pulses whose width represents the phase shift between the frequencies present on the two inputs. These gating pulses are integrated and filtered in a phase loop filter FL4 and produce a control voltage for a voltage-controlled oscillator (VCO). The oscillator produces a frequency dependant on the control voltage it receives. This frequency is divided by a first frequency divider DF1. The locking loop continuously adjusts the control voltage for the oscillator so that the two frequencies received by the phase comparator, that is to say the pilot frequency $F_{ref}$ and the output frequency from the first divider, are kept synchronous. The frequency OL1 produced by the synthesizer is the frequency of the oscillator VCO. The lock therefore maintains this frequency at N1 times the pilot frequency, N1 being the division ratio of the first divider DF1.

The output from the oscillator VCO, at frequency OL1, is applied to another frequency divider DF2, of ratio N3, so as to produce the frequency OL2. A third frequency divider DF3 of ratio N3, receives in this example the output from the second divider and produces the frequency OL3 which will preferably be the sampling frequency $F_{ech}$ directly.

N1, N2 and N3 are integer numbers.

The difficulty resides, as has been explained, in how to choose between the division ratios N1, N2 and N3, which are related furthermore to the choice of pilot frequency $F_{ref}$, so as to render the integrated circuit as universal as possible, that is to say as independent as possible of the type of receiver (GPS or GLONASS or dual) and of the desired application thereof (usage of frequencies L1 alone, or of frequencies L1 and L2).

The noteworthy values of N1 according to the invention are chiefly 140 and 143.

N2 preferably takes the value 10. If N3 is to take one value only, this is the value 3. However N3 can preferably take one of the following three values: 3, 5 or 7. A fourth value is also beneficial, namely the value 8. In this latter case, provision is made for N2 to be able to take one of the two values 10 and 11, the value 11 being chosen when N3=8.

Lastly, the value N1=137 also turns out to be beneficial in addition to the values 140 and 143, and, more rarely, the value 142.

The frequency synthesizer is therefore preferably designed in such a way that the division ratio N1 can be controlled from one or more terminals of the analogue integrated circuit, so that the ratio can be modified by an electrical control signal, as a function of the desired application. It is conceivable for N1 (like N2 and N3 moreover) to be programmable by masking (during the manufacture of the circuit) rather than by electrical control; in this case, very slightly different integrated circuits result, depending on the application desired. It is however preferable for the control to be electrical and effected by terminals for access to the integrated circuit. It is also conceivable for the modification of the value of N1 to be effected by definitive configuring of the integrated circuit in a final manufacturing step, for example by burning out one or more signal routing fuses. This late configuring, which determines the value N1 (and/or N2 or N3) can be effected for example during the edge-testing of the integrated circuits during manufacture.

If N1 is to take only two possible values (140 and 143), and if the control is electrical, a single control pad is sufficient (one control bit) to control the divider DF1. If N1 is to take three or four values, two wires are necessary. One solution consists however in using three control pads (3 bits and hence eight possible values) to choose any value N1 out of the integers from 136 to 143 inclusive.

N3 preferably takes three possible values, and possibly a fourth. Two control pads are therefore desirable.

N2 can either be fixed (N2=10) or controlled by a pad so as to obtain either the value 10 or the value 11. However, as N2 will take the value 11 as soon as N3 takes the value 8, a control pad for N2 can be dispensed with. A simple small decoder placed on the control wires of the divider DF3 will detect the control signal corresponding to N3=8 and will then control the divider DF2 so as to make it take the division ratio N2=11.

Lastly, rather than making provision for three input pads for the control of N1, and two for the control of N3, provision may be made for three control pads (three bits and hence eight possibilities) so as to globally control, by virtue of a straightforward decoding provided in the integrated circuit, particular combinations of N1, N2 and N3; for example the combination N1=140, N2=10, and N3=3 would correspond to a particular state of the group of three control pads.

The paragraphs below explain the use of the invention in detail by giving the values of N1, N2, N3 for the various applications envisaged, together with the pilot frequency $F_{ref}$ which corresponds to each case. The pilot frequency can in fact have any value but it directly influences the choices of the division ratios. It has been found that by using just the two pilot frequencies 10 MHz and 10.23 MHz together with the various division ratios above, at least the possibilities (the most beneficial ones) of the following paragraphs result. It will be understood that the range of possibilities is further broadened with other suitably chosen pilot frequencies.

For each case, the following will be given: the reference clock frequency to be used, the division ratios N1, N2, N3, the type of receiver and its use. Later, the following will be given, firstly for the frequencies L1 and then for the frequencies L2: the local oscillator frequencies OL1, OL2 and OL3 produced by the frequency synthesizer, the intermediate frequencies F1, F2 and the frequency F3 which result therefrom (or the frequency bands in the case of GLONASS).

1.

$F_{ref}$ 10.23 MHz
N1 = 137         N2 = 10    N3 = 3
GPS receiver, civil and military use with frequencies L1 and L2
  a) for the frequency L1:
fundamental frequency at 1575.42 MHz
LO1 = 1401.51             F1 = 173.91 HMz
LO2 = 140.151 MHz         F2 = 33.759 MHz
OL3 = 46.717 MHz          F3 = 12.958 MHz
  b) for the frequency L2:
fundamental frequency at 1227.60 MHz
OL1 = 1401.51 MHz         F1 = 173.91 MHz
OL2 = 140.151 MHz         F2 = 33.759 MHz
OL3 = 46.717 MHz          F3 = 12.958 MHz

2.

$F_{ref}$ = 10 MHz
N1 = 140         N2 = 10    N3 = 3
GPS receiver, civil and military use with frequency L1 and L2 a) for the frequency L1:
fundamental frequency at 1575.42 MHz
OL1 = 1400 MHz            F1 = 175.42 MHz
OL2 = 140 MHz             F2 = 35.42 MHz
OL3 ≅ 46.667 MHz          F3 ≅ 11.247 MHz
  b) For the frequency L2:
OL1 = 1400 MHz            Fi = 172.40 MHz
OL2 = 140 MHz             F2 = 32.40 MHz
OL3 ≅ 46.667 MHz          F3 ≅ 17.267 MHz

3.

$F_{ref}$ = 10 MHz
N1 = 140         N2 = 10    N3 = 7
Standard civil GPS receiver with use of L1 alone
fundamental frequency 1575.42 MHz
OL1 = 1400 MHz            F1 = 175.42 MHz
OL2 = 140 MHz             F2 = 35.42 MHz
OL3 = 20 MHz              F3 = 15.42 MHz

4.

$F_{ref}$ = 10 MHz
N1 = 143         N2 = 10    N3 = 5
Civil GLONASS receiver for the years subsequent to 1998 where the band L1 will extend from 1598 MHz to 1610 MHz
fundamental frequencies: 1598 MHz to 1610 MHz
OL1 = 1430 MHz            F1 extends from 168 MHz to 180 MHz
OL2 = 143 MHz             F2 extends from 25 MHz to 37 MHz
OL3 = 28.6 MHz            F3 extends from 0 MHz to 8.4 MHz

5.

$F_{ref}$ = 10 MHz
N1 = 140         N2 = 10    N3 = 5
Standard civil GPS receiver using the frequency L1
OL1 = 1400 MHz            F1 = 175.42 MHz
OL2 = 140 MHz             F2 = 35.42 MHz
OL3 = 28 MHz              F3 = 7.42 MHz

6.

$F_{ref}$ = 10 MHz
N1 = 143         N2 = 10    N3 = 3
Military GLONASS receiver using the frequencies L1 and L2
  a) frequencies L1 from 1598 MHz to 1620 MHz
OL1 = 1430 MHz            F1 extends from 168 MHz to 190 MHz
OL2 = 143 MHz             F2 extends from 25 MHz to 47 MHz
OL3 ≅ 47.667 MHz          F3 extends from 0.666 MHz to 22.666 MHz
  b) frequencies L2 from 1240 to 1263
OL1 = 1430 MHz            F1 extends from 167 MHz to 190 MHz
OL2 = 143 MHz             F2 extends from 24 MHz to 47 MHz
OL3 ≅ 47.666 MHz          F3 extends from 0.666 MHz to 23.666 MHz

7.

$F_{ref}$ = 10 MHz
N1 = 140         N2 = 11    N3 = 8
Bottom-of-range civil GPS
Fundamental frequency: 1575.42 MHz
OL1 = 1400 MHz            F1 = 175.MHz
OL2 = 127.272 MHz         F2 = 48.148 MHz
OL3 = 15.909 MHz          F3 = 32.24 MHz

8.

$F_{ref}$ = 10 MHz
N1 = 142         N2 = 10    N3 = 5
Future civil GLONASS receiver using the frequency band L1 subsequent to the year 2005
frequencies L1 ranging from 1598 to 1605
OL1 = 1420 MHz            F1 extends from 178 MHz to 185 MHz
OL2 = 142 MHz             F2 extends from 36 MHz to 43 MHz

| | |
|---|---|
| OL3 = 28.4 MHz | F3 extends from 7.6 MHz to 14.6 MHz |

Thus, a few simple combinations of values of the three dividers N1, N2, N3, most of them combined with the use of a reference frequency of 10 MHz (particularly easy to achieve), make it possible to ensure eight possible uses of the circuit without any change thereto (the filters at intermediate frequencies in particular can be the same for all the circuits).

What is claimed is:

1. An analog circuit for receiving GPS or GLONASS satellite signals, comprising:
    frequency transposition circuits including at least one pilot oscillator and first and second frequency dividers linked to the output of the pilot oscillator so as to produce frequencies proportional to the frequency of the pilot oscillator; and
    an analog/digital converter,
        wherein the frequencies proportional to the frequency of the pilot oscillator are used for the generation of he frequency-transposed signals,
        wherein the first frequency divider is used in a loop for locking the frequency of the pilot oscillator, and
        wherein the first frequency divider is programmable so as to provide division ratios 140 and 143.

2. The analog circuit according to claim 1, wherein the division ratios are selected with the aid of electrical control of the division ratio.

3. The analog circuit according to claim 1, further comprising:
    a third divider with a division ratio equal to 3,
        wherein the second divider has a division ratio equal to 10.

4. The analog circuit according to claim 1, further comprising:
    a third divider with a programmable ratio making it possible to choose at least one of the following three ratios; 3, 5 or 7,
    wherein the second divider has a division ratio equal to 10.

5. The analog circuit according to claim 1, wherein the first divider also provides the value 142.

6. The analog circuit according to claim 1, wherein the first divider is programmable so as to provide all the integer values between 140 and 143 inclusively.

7. The analog circuit according to claim 3, wherein the third divider provides a division value equal to 8 and the second divider provides a division value equal to 11.

8. The analog circuit according to claim 1, further comprising:
    a third divider and means for obtaining at least one of the following combinations of division ratios, where N1, N2 and N3 denote the division ratios of the first, second and third dividers, respectively:

| | | |
|---|---|---|
| N1 = 140 | N2 = 10 | N3 = 3 |
| N1 = 140 | N2 = 10 | N3 = 7 |
| N1 = 143 | N2 = 10 | N3 = 5 |
| N1 = 140 | N2 = 10 | N3 = 5 |
| N1 = 143 | N2 = 10 | N3 = 3 |
| N1 = 140 | N2 = 11 | N3 = 8 |
| N1 = 142 | N2 = 10 | N3 = 5 |

9. The analog circuit according to claim 2, further comprising:
    a third divider with a division ratio equal to 3, wherein the second divider has a division ratio equal to 10.

10. The analog circuit according to claim 2, further comprising:
    a third divider with a programmable ratio making it possible to choose at least one of the following three ratios: 3, 5 or 7,
        wherein the second divider has a division ratio equal to 10.

11. The analog circuit according to claim 4, wherein the third divider provides a division value equal to 8 and the second divider provides a division value equal to 11.

* * * * *